United States Patent [19]

Hamming et al.

[11] 4,074,212
[45] Feb. 14, 1978

[54] MULTISECTION FILTER USING INFLECTED AMPLITUDE CHANGE FUNCTION TO SHARPEN ITS BAND-EDGE RESPONSES

[75] Inventors: Richard Wesley Hamming, Monterey, Calif.; James Frederick Kaiser, Summit, N.J.

[73] Assignee: Bell Telephone Laboratories, Incorporated, Murray Hill, N.J.

[21] Appl. No.: 751,125

[22] Filed: Dec. 16, 1976

[51] Int. Cl.² ............................................. H03H 7/10
[52] U.S. Cl. .................................. 333/70 T; 333/28 R
[58] Field of Search .................. 333/28 R, 70 R, 70 T

[56] References Cited

U.S. PATENT DOCUMENTS

| 3,599,108 | 8/1971 | Gardner | 333/70 T |
| 3,922,623 | 11/1975 | Bucherl | 333/70 |

OTHER PUBLICATIONS

Beaton, A. E., et al., *The Fitting of Power Series, Meaning Polynomials, Illustrated on Band–Spectroscopic Data,* in *Technometrics,* vol. 16, No. 2, pp. 147–185, May 1974.

*Primary Examiner*—Alfred E. Smith
*Assistant Examiner*—Harry Barlow
*Attorney, Agent, or Firm*—Charles Scott Phelan

[57] ABSTRACT

A signal to be filtered is subjected to a known filter function a sufficient plurality of times and with appropriate processing to produce in a plot of the total filtering response versus the response of one such function at least one inflection in a portion of the plot corresponding to a transition band between a passband and a stopband of the filter function. Various embodiments of the overall filtering function are shown which are applicable to both recursive and nonrecursive filters and to filters having either single or multiple sets of passband and stopband combinations per filter function.

17 Claims, 11 Drawing Figures

MULTISECTION FILTER USING INFLECTED AMPLITUDE CHANGE FUNCTION TO SHARPEN ITS BAND-EDGE RESPONSES

BACKGROUND OF THE INVENTION

1. Field of the Invention

This invention relates to arrangements for sharpening the frequency response characteristics of a filtering function. The invention relates in particular to arrangements for subjecting a signal to multiple passes through a signal processing function to achieve a frequency response characteristic that is sharper than that which can be achieved by a single pass through the same function.

2. Description of the Prior Art

It often happens that a filter frequency response characteristic is needed which is beyond the capabilities of a hardware filter that is at hand for a circuit designer or a software filter function that is at hand for a computer programmer who is designing a program to simulate a signal processing system. For example, a circuit designer may need a filter function having greater stopband loss and possibly less passband variation about the desired transmission level than can be achieved with a single filter unit which is at hand. In typical prior art arrangements wherein a plurality of such units are combined in order to improve the characteristics in one of the relevant bands, it usually occurs that the filter response in another one of the bands is significantly impaired, and this situation prevails regardless of whether the desired change is increased loss or reduced passband variation. In many instances the designer or the programmer may not have the time or the technological facility to design a new filter or a new subroutine, as the case may be, to meet the new filtering requirements. Alternatively, at least the hardware circuit designer may anticipate a circuit production need that is insufficient to warrant the expense of redesign, especially if the filter is an integrated circuit chip, as is often the case for certain filtering situations in the present state of the art.

As already noted, it is known in the art to subject a signal to multiple passes through a given function, e.g., by using tandem filter chips of like characteristics, or by using successive applications of a known filtering software subroutine, or using successive passes of the signal through a single filter section with appropriate delays between passes. However, in such response-sharpening arrangements the multiple applications of a given filter function usually improve the response in one aspect at the expense of deteriorated response in another aspect. This is also true of prior proposals for systems in which so-called smooth and rough resultants of a filtering operation are again subjected to a smoothing operation. A smooth resultant is the normal filter section output and the rough resultant is a signal corresponding to the energy portion removed to get the smooth resultant, i.e., the rough resultant is the resisual.

SUMMARY OF THE INVENTION

The foregoing problems of the prior art are mitigated in an illustrative embodiment of the present invention in which a signal is processed by at least three successive passes through a given filter function. Following at least one of the passes the filtered output and the residual of the one pass are combined and the resulting sum signal is employed as the output signal of that pass in the sequential series of passes.

It is one feature of the invention that the overall response of the multiple passes has reduced passband and stopband amplitude variations as compared to a single section; and the transition band therebetween is steeper, i.e., the response has been sharpened, because the amplitude difference between the minimum passband variation and the maximum stopband variation has been increased.

Another feature is that the sharpening effect achieved is similar for all passbands and stopbands of the given filter function, and the degree of sharpening for each set of bands is the same and depends upon the number of passes through the given filter function.

A further feature is that the invention is applicable to nonrecursive and recursive filters although in the latter instance time sequence reversals are employed to offset the nonuniform phase response of the recursive filters.

BRIEF DESCRIPTION OF THE DRAWINGS

A more complete understanding of the invention and its various features, objects, and advantages may be obtained from a consideration of the following detailed description in connection with the appended claims and the attached drawings in which:

DETAILED DESCRIPTION

Figure 1:
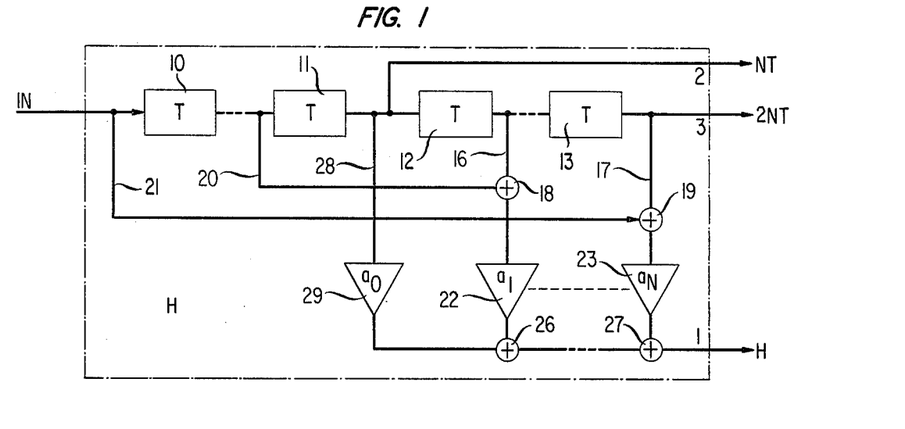
FIG. 1 is a functional diagram of a well-known symmetric nonrecursive filter section which is useful in describing the present invention and several of its applications.

FIG. 1 is a block and line diagram of one form of filter section to which the present invention is applicable. It is used herein for purposes of illustration since it is a common type of filter that is often implemented as a digital circuit in either a semiconductor integrated circuit chip form or a software subroutine form to be run in a computer simulation of an electric circuit system. In the discussions which follow, the hardware format is primarily the one dealt with although the invention is similarly applicable in either technology. Likewise, although a digital pulse-coded signal embodiment will be used for purposes of the description, it will be appreciated by those skilled in the art that the invention is also applicable to other technologies such as the charge-coupled device technology using sampled data input signals.

The filter section is designated as the filter H, that being a short form representation of the mathematical designation $H(f)$ representing the multifrequency response characteristic of the section. Filter section H, as shown in FIG. 1, is a symmetric, finite impulse response filter with an odd number $2N+1$ of taps. N is equal to one-half the number of delay elements, and in the specific embodiment of FIG. 1 only four ($N=2$) such elements are actually shown. In that general form it can be arranged to perform different practical filtering functions. One such function is, for example, that of a bandpass filter which is advantageously useful, when employed according to the present invention, in a bank of such filters for selecting a given frequency in a received signal which includes the different frequencies from time to time of a multifrequency signaling system. In such an application, the filter H typically has $N=25$, i.e., 51 delay line taps. The filter of FIG. 1 is a nonrecursive filter having a uniform phase response across the entire band of frequencies of interest. However, the invention can also be applied to recursive filters using time inversion as will be hereinafter demonstrated.

For purposes of discussion herein, a bit-parallel system is assumed. An input signal to the filter of FIG. 1 is applied on the IN lead to the input of a tapped delay line which advantageously includes four shift registers 10, 11, 12 and 13 operated in tandem at the sample rate of the incoming pulse-coded digital signal, e.g., linear pulse code modulated sample words, for the filter. The clock source for such operation is not shown in the drawing. Each of the four shift registers represents a time delay T corresponding to the sample rate, i.e., the pulse-coded word rate, of the input digital signals to the filter. The final taps, e.g., 16 and 17, on the delay line are coupled to respective adders 18 and 19 wherein they are combined with symmetrically positioned input taps 20 and 21, respectively, from the same delay line. Outputs from adders 18 and 19 are coupled through respective multipliers 22 and 23 to inputs of further adders 26 and 27, respectively.

A central tap 28 on the illustrated delay line is coupled through a multiplier 29 to an additional input on the adder 26; and an output of that adder is, in turn, coupled to an additional input on the adder 27. The output of adder 27 is the filtered, or processed, output of the filter section H; and this output is further designated as No. 1 to distinguish it from two additional outputs which are also advantageously provided in the filter section H. The signal appearing in the output No. 1 is delayed from the corresponding signal applied to the input of the filter section by an interval NT, i.e., by half the delay of the aforementioned delay line as is well known in the art. An output No. 2 is also provided on the filter section H from the center tap 28 of the delay line to make the filter section input signal available in an unprocessed form except that it is delayed by the same interval NT. Still another output No. 3 is provided from the final tap 17 of the delay line to make the filter section input signal available in an unprocessed form except that it is delayed by the interval 2NT, i.e., the full delay of the filter section delay line.

Multipliers 29, 22, and 23 have multiplication coefficients $a_0$, $a_1$, and $a_N$, respectively. These coefficients are selected to provide the filter section H with the desired type of passband and stopband characteristics. In some applications the multiplier coefficients will be built into the circuit as part of the single integrated circuit chip constituting the filter section H. In other applications, however, the multiplier coefficients are advantageously assigned from an associated read only memory, not shown, from which successive sets of coefficients are read out to control the multipliers in different ways in different digital word times.

As previously indicated herein, occasions can arise when it is necessary to perform a filtering function which is beyond the capabilities of the filter section H of FIG. 1. In some such cases, a plurality of the sections H are interconnected to enhance the single-section response to meet the new need.

Figure 2:
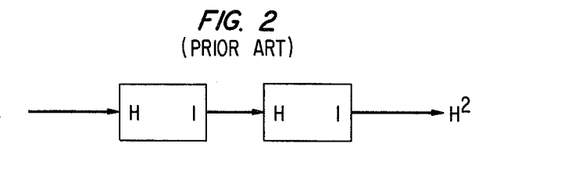
FIGS. 2 and 3 are simplified diagrams of two prior art arrangements for filter response sharpening.
Figure 5:
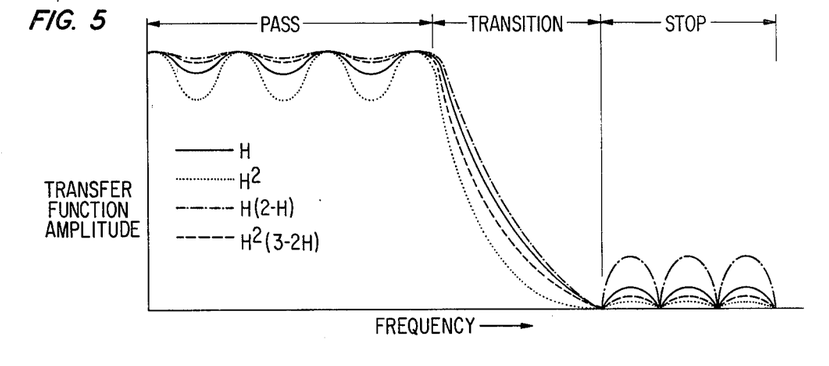
FIG. 5 is a diagram of amplitude versus frequency characteristics for a passband and an adjacent stopband as realized in the filters of FIGS. 1 through 4A and 4B.

FIG. 2 depicts one prior art arrangement in which two sections of the filter illustrated in FIG. 1 are simply connected in a tandem coupled signal path to provide an overall filtering function which is conveniently designated $H^2$. The amplitude versus frequency characteristic of this FIG. 2 type of combination is depicted in a typical lowpass filter embodiment in the transfer function amplitude versus frequency characteristics plotted in FIG. 5. Filter characteristics shown in FIG. 5 are actually shown for filters having the higher values of N, e.g., 25, more usually found in the art where a goal is a relatively sharp cutoff, in order to facilitate comparisons between different multisection combinations. In addition, those characteristics are exaggerated in vertical scale for further facilitating those comparisons.

In FIG. 5, the FIG. 2 $H^2$ arrangement is shown as the dotted wave diagram and can be readily compared with the characteristic of the single section of FIG. 1 which is depicted as a solid line characteristic in FIG. 5. It is noted in FIG. 5 that although the characteristics in both cases have significant ripple in both the passband and the stopband, the ripple in each case has a substantially uniform value across each such band as characterizes the linear piecewise type of functions to which the present invention is applicable. This linear piecewise characteristic in the passbands and stopbands is essential in order to be able to combine similar filter sections to sharpen a given filtering characteristic rather than generating an entirely new type of charcteristic as would be the case if the basic section did not have the linear piecewise feature. Further comparing in FIG. 5 the characteristics of the arrangements of FIGS. 1 and 2, it is seen that the tandem combination of two sections as in FIG. 2 greatly reduces the extent of the ripple in the characteristic in the stopband. It also sharpens the characteristic by giving it a steeper slope in most of the transition band between the passband and the stopband, but it greatly increases the extent of ripple in the passband. Thus, the simple tandem combination of section improves filter performance in the stopband, sharpens the transition band characteristics, but greatly impairs the passband characteristics.

Figure 3:
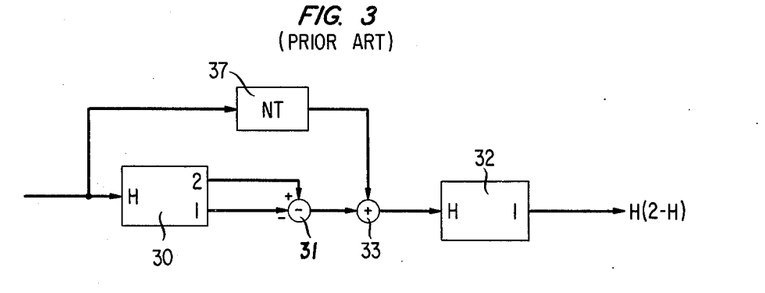

FIG. 3 illustrates another prior art type of filter-characteristic-sharpening arrangement utilizing plural successive sections of the filter section in FIG. 1. However, in this embodiment of the prior art a limited amount of additional signal processing of an arithmetic nature is performed with respect to the tandem coupled signal path of the overall multisection filter. The processing involves particular interactions between the input to a filter section and an output therefrom. In this embodiment, an input section 30 has its processed output at the No. 1 output thereof subtracted in a subtraction circuit 31 from an equally delayed form of the same filter section input appearing at the output No. 2 of the section 30. The difference signal in the output of subtraction circuit 31 is the residual of the filtering operation of section 30. That is, it represents in a sense the signal information which was rejected by the filter 30. This residual signal is combined with an appropriately delayed form of the input signal to the section 30 by an adder 33. The delay in this case is provided by a delay circuit 37 in an amount NT, i.e., 2T for the filter elements actually shown in FIG. 1. The sum output of the adder 33 is applied through a further, like, filter section 32 to produce the amplitude response there indicated of H(2−H). This response, assuming the same filter section H used for FIGS. 1 and 2, is also illustrated in the filter transfer function amplitude versus frequency characteristics of FIG. 5 by the dash-dot characteristic. That characteristic is seen to be greatly improved in the passband as compared to the characteristic of the single section of FIG. 1 because it evidences a much lower ripple level. However, in the transition band the characteristic is not quite as good because it evidences a more shallow slope than does the characteristic for a single section. In the stopband the performance of the FIG. 3 embodiment is much worse than that of any other shown because it displays a much higher degree of ripple in the characteristic.

Figure 4A:
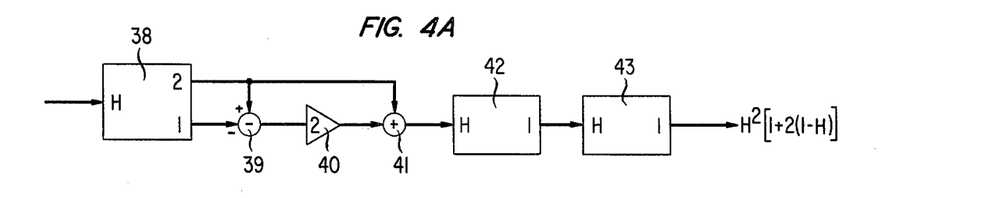
FIGS. 4A and 4B are diagrams of different implementations of one embodiment of the present invention utilizing at least three filter sections for filter response sharpening.
Figure 4B:
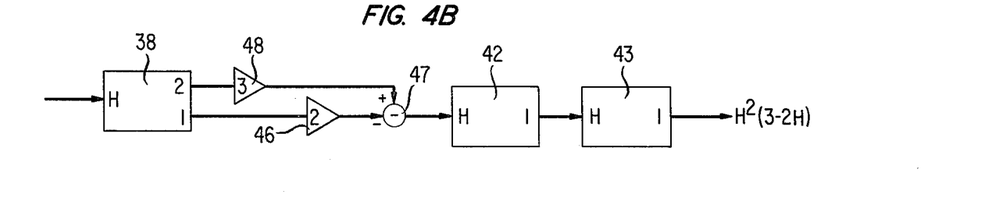

FIGS. 4A and 4B depict different, but functionally equivalent, implementations of one embodiment of a multisection filter in accordance with the present invention. In this embodiment at least three sections of the type shown in FIG. 1 are combined in a tandem coupled signal path. In addition to the third tandem section, the signals from at least one of the sections in the tandem sequence are additionally processed in an essentially arithmetic fashion by interacting section input with output. However, the manner of that interaction is different from that employed by the prior art as evidenced in the embodiment of FIG. 3. Unexpectedly in the light of FIGS. 2 and 3, the additional section and the different processing have the effect, as evidenced in FIG. 5, of improving the multisection filter characteristic in both the passband and the stopband.

To accomplish the aforementioned improved result in FIG. 4A, a first section 38 has the No. 1 output thereof applied through a subtraction circuit 39 where it is subtracted from the No. 2 output of the same section to produce a residual signal as was done in FIG. 3. However, in FIG. 4A the residual signal is applied through a multiplier 40 effecting a gain of two to one input of an adder 41 wherein the doubled residual signal is added to the equally delayed No. 2 output of the section 38. The sum output of adder 41 is then coupled through two additional filter sections 42 and 43 to provide an overall multisection filter output having the form $$H^2[1 + 2(1-H)]. \tag{1}$$

In the functionally equivalent embodiment of FIG. 4B, the three tandem sections 38, 42, and 43 are still utilized; but in this case the signal interaction, or processing, associated with the section 38 is modified somewhat from that shown in FIG. 4A to eliminate the adder 41 and to add a multiplier. Thus, in FIG. 4B the No. 1 output of the section 38 is coupled through a multiplier 46 effecting a gain of two to one input of a substraction circuit 47 where it is subtracted from the output of a multiplier 48 effecting a gain of three and which is responsive to the output No. 2 of the filter section 38. The difference output of the subtraction circuit 47 is coupled through the additional tandem filter sections 42 and 43 to the multisection output in the form $H^2(3-2H)$. It is apparent that the expressions for the outputs of the multisection filters in FIGS. 4A and 4B are algebraically equivalent.

Looking to FIG. 5, the amplitude versus frequency characteristic of the embodiments of FIGS. 4A and 4B is indicated by the dashed characteristic which shows substantialy less ripple than does the single-section characteristic in both the passband and the stopband. In addition, the transition band portion of the dashed characteristic has a steeper slope than either the single-section version of FIG. 1 or the FIG. 3 version to evidence significant sharpening of the overall filter characteristic.

In summary, it is evident from FIG. 5 that the embodiment of FIGS. 4A and 4B improved the amplitude versus frequency response characteristic in the passband, the transition band, and the stopband as compared to the response of a single section. Whereas in prior art arrangements, any improvement realized at one of the bands was accompanied by substantial impairment in at least one other of the bands.

Figure 6:
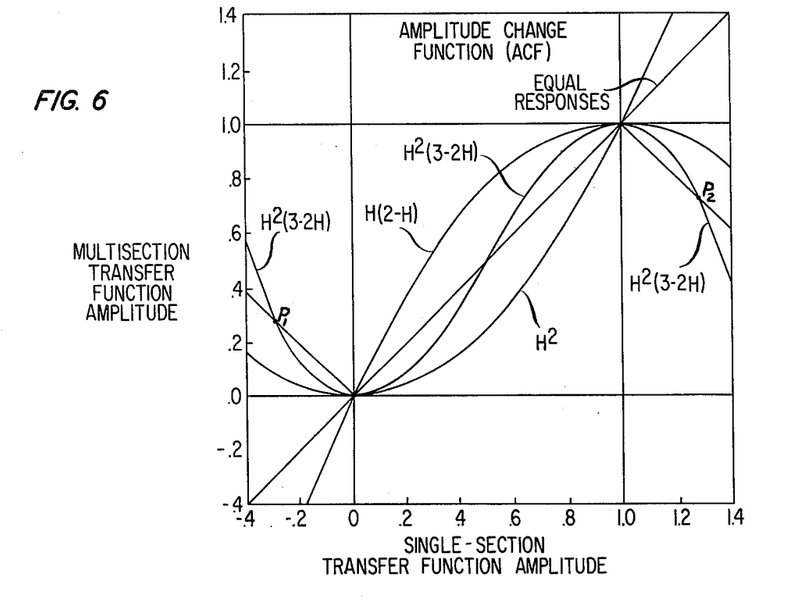
FIG. 6 is a diagram of amplitude change functions for the filters of FIGS. 1 through 4A and 4B.

FIG. 6 depicts amplitude change functions (ACF) of the filters in FIGS. 2 through 4B. This diagram of FIG. 6 illustrates the improvement realized by the embodiment of FIGS. 4A and 4B in a new way. In FIG. 6 there are plotted on linear scales of dimensionless units the filter transfer function amplitudes, i.e., the ratio of filter output amplitude in response to corresponding input signal amplitude. The transfer function amplitude of the multisection filter is plotted against the transfer function amplitude of the basic single-section filter. The single-section filter is a single application of some predetermined filter function be it a hardware filter or a software simulation routine. The FIG. 1 filter H is one such single-section filter, and the new multisection filter is some combination of copies of the old filter sections, such as the combinations illustrated in FIGS. 2 through 4B.

Frequency aspects are not directly represented in the diagram of FIG. 6, but it must be understood that they underlie the ACF plot there presented with assumptions that unity transfer function amplitude corresponds to the passband amplitude response and zero transfer function amplitude corresponds to the stopband amplitude response. In all cases it is assumed for the purposes of FIG. 6 that all of the illustrated characteristics pass through the (0,0) and the (1,1) coordinates representing the stopband and passband responses, respectively. However, that situation could change in some cases as will be subsequently discussed. The different characteristics illustrated in FIG. 6 have different shapes apart from the indicated coordinate points through which they all pass. Thus, it is found that once an ACF is determined for some filter H(f) it applies to all combinations of stopbands, passbands, and their intermediate transition bands for that particular filter section regardless of how many such combinations there are.

In FIG. 6 a straight line extends diagonally across the diagram through the aforementioned stopband and passband coordinates. This is the line of equal responses for the single-section and multisection filters. Similarly, lines of negative slope, equal in slope magnitude to that of the aforementioned diagonal line and extending to the left from the (0,0) coordinate and to the right from the (1,1) coordinate, represent equal departures in opposite directions from the zero amplitude and unity amplitude, respectively, for the single-section and multisection filters.

The $H^2$ characteristic in FIG. 6 represents the ACF for the FIG. 2 prior art embodiment. That ACF characteristic is tangent to the multisection zero amplitude level at the (0,0) coordinate and it intersects the unity level at the (1,1) coordinate with a slope twice that of the equal-response line. Implicit in this diagram is the fact that the parabolic shape of the $H^2$ characteristic around the (0,0) coordinate indicates improved stopband performance because small errors, i.e., departures from the zero amplitude, in the single-section output produce much smaller corresponding departures in the output of the multisection filter. This advantage holds true as long as the $H^2$ ACF lies below the equal response and departure lines. On the other hand, in the vicinity of the (1,1) coordinate the $H^2$ ACF departures from the unity amplitude are nearly doubled as compared to the single-section departures. This analysis of the FIG. 6 ACF characteristic is borne out by the information contained in the FIG. 5 amplitude versus frequency characteristics previously described.

The FIG. 6 ACF characteristic H(2-H) for the FIG. 3 embodiment is more or less the opposite of the case for the FIG. 2 embodiment. That is, the characteristic for the FIG. 3 embodiment is broadly tangent to the unity amplitude ordinate at the (1,1) coordinate, and it extends on a nearly straight path through the (0,0) coordinate of the stopband. Thus, in the vicinity of the passband, the FIG. 3 embodiment produces smaller errors than either the single-section filter or the FIG. 2 multisection embodiment; but the performance of the FIG. 3 embodiment is much worse around the stopband (0,0) coordinate.

It has been found, however, that if the ACF for the multisection filter is tailored to be tangent, at both the (0,0) coordinate and the (1,1) coordinate and to be continuous, i.e., to have an inflection between those two points, the combined multisection filter exhibits improved response over the single-section filter in both the passband and the stopband. This improvement in both bands is an advantage not found in the prior art multisection filters. One polynomial that describes such a tailored ACF is:

$$H_T = H_S^2(3 - 2H_S) \qquad (2)$$

wherein $H_T$ is the total response of the multisection filter combination and $H_S$ is the response of the single-section filter utilized to make up the multisection filter. The foregoing expression will be recognized as corresponding to the previously noted third order expression for the response of the embodiment of FIG. 4B. Once again, this expression deals only in transfer function amplitudes and is used with the understanding that where is requires that signal components be combined by arithmetic operations, the combined components must be equally delayed components. The third order expression in equation (2) requires three successive passes of the signal through the section $H_S$. Consequently, by requiring those three passes of the signal through the same filter and by adding somewhat more arithmetic than was employed in the prior art there is realized a substantial sharpening of the net filter performance. Small deviations from zero and unity in the single-section response are both approximately squared in the multisection response and are thus greatly reduced. The transition band is left essentially the same because the continuous ACF characteristic in that region necessarily includes an inflection so that the transition band portion of the characteristic is comparatively close to the straight line equal response characteristic. As already pointed out, the ACF presentation is based upon filter transfer function amplitudes; and it applies equally well to lowpass, highpass, bandpass, and bandstop filters of any complexity having any number of passbands and stopbands as long as the passband is piecewise constant and in that band the single-section and corresponding multisection filters have equal gains, i.e., unity gain as represented in FIG. 6.

Thus, if there is a subroutine that does some filtering job, then a single short program can be used to process the signal. First that subroutine is used once, the result is doubled and the doubled output is substracted from a signal at three times the equally delayed input signal sample character value. Finally the resulting difference signal is processed twice more in the subroutine to yield a signal processed by a greatly sharpened filter function of approximately three times the effective length of the single subroutine filter. The FIG. 6 characteristic $H^2(3-2H)$ for the FIG. 4B embodiment shows the amplitude change function for the total indicated filtering process. Note that for negative amplitudes and for values greater than unity of the single-section amplitude, the multisection amplitude has values between zero and unity. Furthermore, the method squares, e.g., reduces deviation errors in, a fairly good filter, i.e., one with an ACF having much lower slope near the (0,0) and (1,1) coordinates than do the equal response and departure lines. Notice, however, that poor filters, i.e., those with single-section ACF deviations outside points $P_1$ and $P_2$, in FIG. 6, may be worse since for single-section amplitudes of either $-0.281$ or $+1.281$ the multisection deviation amplitude has the same size as the single-section deviation amplitude; and outside of the $P_1$-$P_2$ range the multisection amplitude deviation values are larger than the single-section amplitude values.

A useful generalization for extending the inflected ACF situation to other applications is to construct a polynomial having an $n^{th}$ order tangency at zero, and $m^{th}$ order tangency at unity, and passing through the (0,0) and (1,1) coordinates. such a polynomial can be shown to be of the form:

$$H_T = H_S^{n+1} \sum_{k=0}^{m} \frac{(n+k)!}{n!k!} [1-H_S]^k . \qquad (3)$$

The present invention involves the cases embraced by the values $n=0$, $m>1$ and $n>1$, $m>1$. Those cases exclude the filter circuits of the type in FIG. 2 ($n>0$, $m+0$) and FIG. 3 ($n=0$, $m=1$).

One interesting special case is that in which $m=n$, and for the first few applications of that case the following table is developed:

| n=m= | Infected ACF Examples |
|---|---|
| 1 | $H_S^2(3-2H_S)$ |
| 2 | $H_S^3(10-15H_S+6H_S^2)$ |
| 3 | $H_S^4(35-84H_S+70H_S^2-20H_S^3)$ |

The product of the constant coefficient in the parentheses and the $H_S^{n+1}$ factor in each case indicates by its magnitude the quality of the tangency in the vicinity of the coordinate (0,0) and by symmetry, in the vicinity of the coordinate (1,1) for these symmetric cases. That is, the smaller the product, the stronger will be the correction effected by the multisection filter on amplitude deviations in FIG. 5.

The first symmetric embodiment in the foregoing table corresponds to the embodiment of FIGS. 4A and 4B. The second case in the table is a fifth order embodiment depicted in different implementations in FIGS. 7 and 8 herein. In those two figures, as well as in other embodiments of the present invention, the sequence of filter sections in any tandem coupled signal path can be the illustrated sequence or any other algebraically equivalent sequence.

Figures 7, 9:
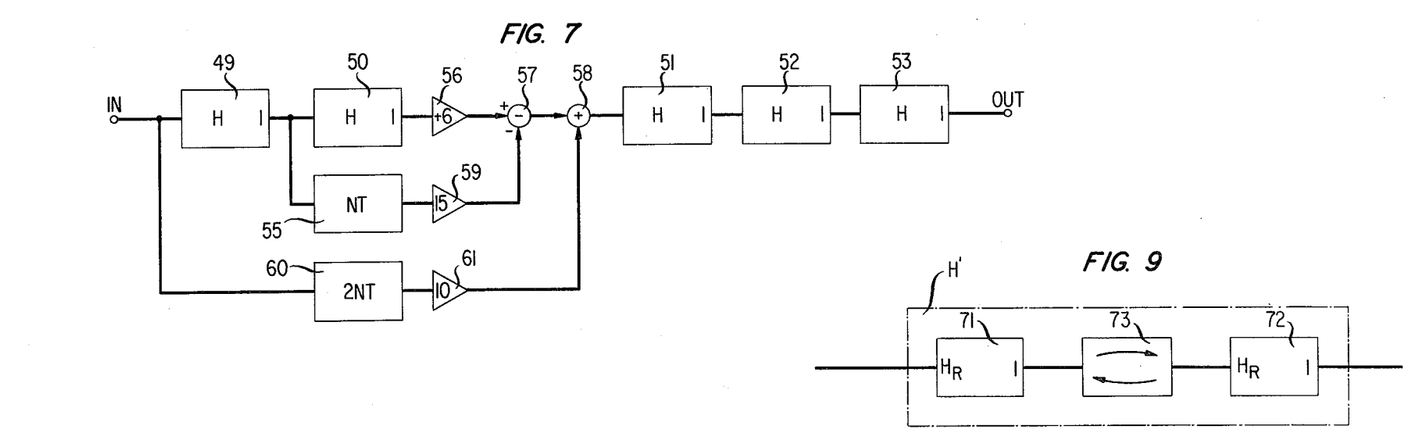
FIGS. 7 and 8 are different implementations of a further embodiment of the present invention providing increased sharpening as compared to the embodiment of FIGS. 4A and 4B.
FIG. 9 is a diagram of a filter section for a recursive filter that is useful in embodiments of the present invention.

In FIG. 7, five filter sections 49 through 53 are connected in a tandem coupled signal path with the multisection input applied to the input of section 49, and the multisection output obtained from the output of the final filter section 53. The output of the section 50 is interacted in a subtractive fashion with the equally delayed input of that section, and the resulting difference signal is then additively modified by an equally delayed signal from the input of the section 49 to produce a combined tandem coupled signal path output for the sections 49 and 50 to drive the section 51. For this purpose the processed output of the section 50 is coupled through multiplier 56 providing a gain of six to one input of a subtraction circuit 57. The input signal from the same section 50 is coupled through a delay circuit 55 having a delay NT, i.e., N sample times, corresponding to the delay from the section 50 input to its processed output. Output of delay circuit 55 is then coupled through multiplier 59 supplying a gain of 15 to a subtrahend input of the subtraction circuit 57. The difference signal output of the subtraction circuit 57 is applied to one input of an adder 58 wherein it is combined with the input signal of the section 49 after that signal has been coupled through a delay circuit 60 having a delay 2NT and a multiplier 61 effecting a gain of ten. Gains of multipliers 56, 59 and 61 correspond to coefficients in the expression for the fifth order symmetrical case of $n = m = 2$ from the partial table of symmetrical case applicatons hereinbefore presented. Stated differently, the input and output signals of the section 49 are interacted, and the interaction circuits include nested therein the section 50 with its own indicated input and output signal interacting circuits.

Figure 8:
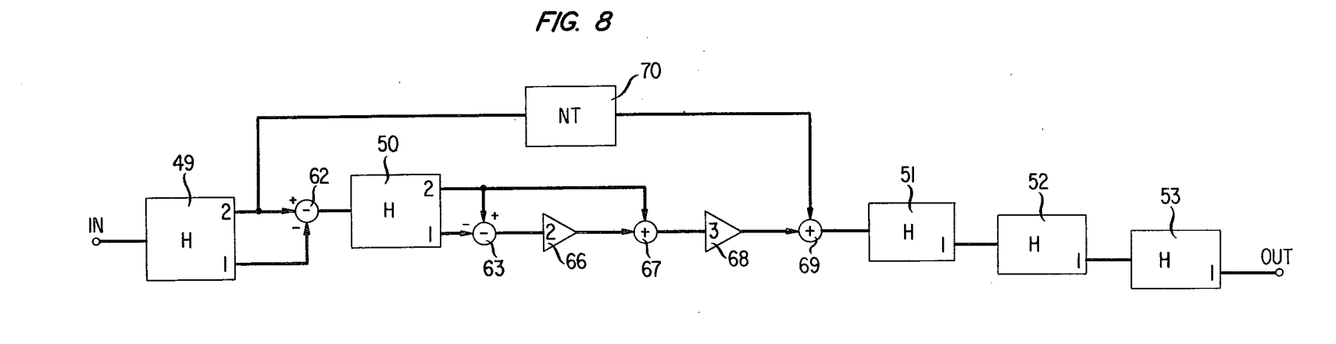

FIG. 8 is another implementation of the fifth order multisection filter shown in FIG. 7. In FIG. 8 the same five filter sections 49 through 53 are employed in the tandem coupled signal path, but the section signal interacting circuits for the embodiment of FIG. 8 are different from those of FIG. 7. As in the case of FIGS. 4A and 4B, the difference reflects a different, but equivalent, algebraic expression of the same filter function. In FIG. 8 the processed output No. 1 of section 49 is subtracted in a subtraction circuit 62 from an equally delayed version of the input signal to the same section provided from the No. 2 output of that section. The resulting residual signal is applied to drive the filter section 50. A residual signal from the latter section is derived by a further subtraction circuit 63 and applied by a multiplier 66, with a gain of two, to one input of an adder 67. That adder combines the output of multiplier 66 with the equally delayed version of the input signal to section 50 and the sum is applied through a further multiplier 68, inserting a gain of three, to an input of an adder 69. The other input to adder 69 is supplied with the No. 2 output of filter section 49 after a delay of N sampling intervals in a delay circuit 70 so that augend and addend signals are equally delayed. The output of adder 69 is utilized to drive the three further tandem filter sections 51 through 53.

This connection arrangement in FIG. 8 achieves the same amplitude change function as does the implementation of FIG. 7; and although it requires one additional adder and one additional subtraction circuit, it has the advantage of requiring one less separate delay circuit and one less multiplier. In addition, the multipliers that are provided are simpler because they have substantially lower gain than do any of those shown in FIG. 7. As was the case in FIG. 7, the implementation of FIG. 8 can be considered in two different ways. On one hand, it can be considered that the interaction of signals for the section 50 provides a signal which is further modified by an equally delayed version of the input signal to section 49. On the other hand, it can be considered that the signals of the section 49 are interacted to provide a signal for driving the tandem sections 51 through 53 and that those interaction circuits include nested therein the further section 50 and its signal interacting circuits.

Returning to more general considerations, it has been observed that one advantage of the present invention is that is provides a convenient way to sharpen the response characteristics of a single-section filter function without the need for designing a totally new filter section. In this connection it has been found, and it can be shown mathematically, that if one compares a multisection filter formed with an inflected amplitude change function in accordance with the present invention with the best single-section filter that might be designed by prior art techniques to provide the same frequency response, the latter single-section filter for the third order ACF still requires at least two-thirds the number of multiplications. For even higher orders of ACF the equivalent single-section filter would require at least one-half the total amount of computation required in a multisection filter in accordance with the present invention. Thus, a circuit designer or a program designer can, on that basis, determine whether or not it is advantageous for a particular task to employ multiple applications of the available filter section to generate a new filter section to achieve the desired new frequency response.

FIG. 9 illustrates a modified filter section H' for use in situations where recursive filters are involved. Filters previously considered herein have been symmetric nonrecursive filters, i.e., filters having an essentially linear phase response across the frequency bands of interest. In recursive filters, however, the phase response is typically nonlinear. FIG. 9 illustrates a technique for dealing with that nonlinear phase response. This technique is primarily useful for software applications simulating a hardware filtering system that permits batch processing of data. One example of such an application is the processing of a predetermined block of experimental data. It will be apparent to those skilled in the art that the technique can also be effected by hardware, but in the present state of the art such a hardware implementation will often be more costly than designing a new single-section recursive filter for the job.

In FIG. 9 the block and line diagram indicates the nature of the software process. Thus, two recursive filter sections 71 and 72, each of which is otherwise designated $H_R$, are connected in tandem by a time sequence reversing circuit 73. The overall filter section H' receives digital pulse coded signal sample words the same as for FIG. 1. A data block of such words is first filtered by one application 71 of the known recursive filter routine. The filter output is then loaded into a memory, e.g., a set of word storage registers, from which it is read out in the reverse of the sequence in which it was loaded. Such memory and associated logic operations are represented by reversing circuit 73. That reversed-sequence data block is then filtered a second time in the same known filter routine. This process eliminates the effect of the nonlinear phase response of a single application of the routine, but it increases the passband ripple because of the FIG. 5 $H^2$ effect, and an extra time inversion is required if there are an odd number of sections $H'$.

Figure 10:
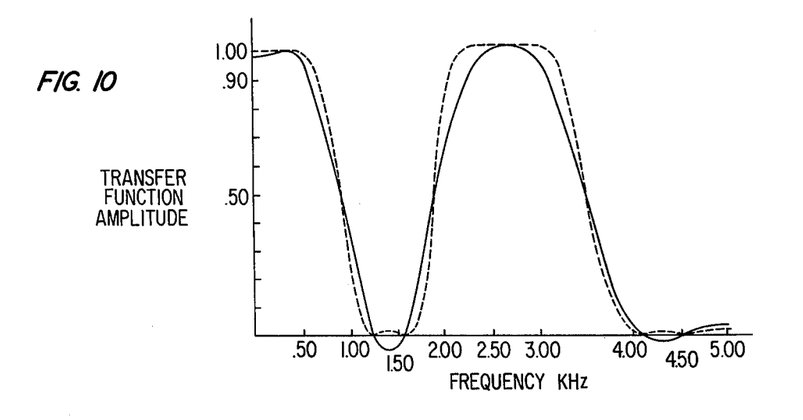
FIG. 10 is a diagram of amplitude versus frequency characteristics for a filter section having multiple passbands and multiple stopbands and illustrating the sharpening of those characteristics by application of the present invention.

FIG. 10 is a plot of amplitude versus frequency in kHz in which there are compared the single-section (solid line) and multisection (dashed line) characteristics for the case in which each single-section filter has plural passbands and plural stopbands. The FIG. 5 scale exaggeration is not used in FIG. 10 so ripple amplitude is less prominent. In addition a simpler filter is employed so there are fewer ripples in each band. The multisection filter includes sections combined in accordance with the invention as shown, for example, in FIG. 4B, to have an inflected ACF. Filter sections H of the type shown in FIG. 1 are employed and all are alike. Each section has two passbands and two stopbands as shown in FIG. 10. It can thus be seen from FIG. 10 that both the passbands and the stopbands exhibit flatter response over somewhat broader frequency ranges for passbands and stopbands in the multisection embodiment (dashed curve) than in the single-section embodiment (solid curve).

It is sometimes useful to impose selective effects upon a filter to meet particular needs. Such an operation is facilitated by appropriately determining a polynomial in H for the inflected amplitude change function to meet the indicated need. Then either hardware, or appropriate software routines, for the single filter sections and any necessary gain, delay, and arithmetic functions are combined to implement the newly determined polynomial.

Although the present invention has been described in connection with different particular embodiments thereof, additional embodiments, applications and modifications which will be obvious to those skilled in the art are included within the spirit and scope of the invention.

What is claimed is:

1. In combination,
   a plurality of filter sections of predetermined frequency response characteristics,
   means for connecting said sections in a tandem signal path to sharpen the transitional portion of said characteristics between each stopband and any adjacent passband thereof, and
   said connecting means includes means for interconnecting said sections so that a plot of the amplitude change function of overall tandem transfer function amplitude versus the transfer function amplitude of one section of the combined sections is described by $$H_T = H_S^{n+1}(f) \sum_{k=0}^{M} \frac{(n+k)!}{n! \, k!} [1 - H_S]^k$$

where $H_T$ is the transfer function amplitude as a function of frequency of said interconnected sections, $H_S$ is the transfer function amplitude as a function of frequency of one of said sections, $n$ and $m$ are the orders of tangency of the polynomial plot at ordinates of 0 and 1, respectively, the plot passing through the (0,0) and (1,1) coordinates, and the set $n$ and $m$ having positive integer set values other than the sets $(n=0, m=1)$, $(n\ 1, m=0)$, and $(n=m=0)$.

2. A method for sharpening the responses of a filter function having at least one passband and a spectrally adjacent stopband for extracting from an input signal a predetermined output signal and rejecting a predetermined residual signal, the method comprising the steps of
   sequentially processing said input signal through said function at least three times, and
   following one of said sequential processing steps, additively combining the output signal of that one step and the residual signal of that one step.

3. In combination,
   at least one limited-band filter unit having a predetermined passband characteristic portion, a predetermined stopband characteristic portion, and a transitional characteristic portion connecting the passband and stopband portions, and
   means for applying a signal to such filter unit a sufficient plurality of times to produce an overall amplitude change function having at least one inflection in a portion thereof corresponding to said transition band.

4. A multisection filter comprising
   at least three filter sections, each section having a predetermined filtering characteristic,
   means for coupling said sections for tandem operation in a predetermined signal path between an output and an input of said multisection filter, and
   said coupling means comprising means for interacting an output of a first one of said sections, at any sequential section position in said path, and the signal path input signal to the same section to produce the signal path output for such section.

5. A multisection filter in accordance with claim 4 in which said interacting means comprises
   means for deriving a residual signal for the operation of said first section, and
   means for adding the residual signal to said signal path input signal for the same section to produce said signal path output for such section.

6. A multisection filter in accordance with claim 5 in which
   said residual deriving means comprises means for subtracting a filtered output signal of said first section from an equally delayed signal representation of the input of said first section, and
   said adding means comprises
   means for doubling said residual signal, and
   means for combining the equally delayed input of said first section and the doubled residual signal.

7. The multisection filter in accordance with claim 6 in which
   said first section is the initial section in the tandem coupled signal path, and
   the remaining ones of said filter sections are driven in such path by the signal path output of said initial section.

8. The multisection filter in accordance with claim 4 in which said interacting means comprises
   means for subtracting a signal at twice the processed output amplitude of said first section from an equally delayed signal at three times the amplitude of the input of said first section to produce said signal path output of such section.

9. A multisection filter in accordance with claim 4 comprising
five of said sections provided in the tandem coupled signal path,
said interacting means comprises means for subtracting a signal at six times the processed output amplitude of said first section from an equally delayed signal at fifteen times the amplitude of the input of said first section to produce the signal path output of said first section,
a second one of said sections precedes said first section in the tandem coupled signal path, and
means are provided for adding the first section signal path output and an equally delayed signal at 10 times the amplitude of the input to said second section to produce a combined signal path output of said second section and said first section.

10. A multisection filter in accordance with claim 4 in which
five of said sections are provided in the tandem coupled signal path, and
said interacting means comprises
a second one of said sections following said first section in said tandem coupled signal path,
means for subtracting a signal at fifteen times the amplitude of the input to said second section from an equally delayed signal at six times the processed output of said second section to produce a signal path output of said second section, and
means for adding said signal path output of said second section to an equally delayed signal at ten times the amplitude of the input to said first section to produce a combined signal path output of said first section and said second section.

11. The multisection filter in accordance with claim 6 in which
five of said filter sections are provided,
a second one of said sections precedes said first section in said tandem coupled signal path,
means are provided for deriving a residual signal for the operation of said second section to produce a signal path output of said second section as an input to said first section, and
means are provided for adding a signal at three times said signal path output of said first section to an equally delayed signal corresponding to said input to said second section to produce the combined signal path output of said second section and said first section.

12. The multisection filter in accordance with claim 4 in which
five of said sections are provided in the tandem coupled signal path,
said interacting means comprises means for subtracting the processed output of said first section from an equally delayed signal corresponding to the input of such section to produce said first section signal path output,
a second one of said sections follows said first section in said tandem coupled signal path sequence and is driven by said first section signal path output,
means are provided for deriving a residual signal for the operation of said second section,
means are provided for adding a signal at twice the amplitude of said residual of said second section to an equally delayed signal corresponding to said input of said second section, and
means are provided for adding a signal at three times the output amplitude of said adding means to an equally delayed signal corresponding to said input of said first section to produce a combined signal path output of said first and second sections.

13. A multisection filter in accordance with claim 4 in which each of said sections comprises
a recursive filter function, and
means for time sequence inverting the results of a first application of such function to form the input for a second application of said recursive filter function.

14. The multisection filter in accordance with claim 4 in which
each of said sections is a symmetric nonrecursive filter in which each passband and each stopband is piecewise constant.

15. The multisection filter in accordance with claim 14 in which said symmetric nonrecursive filter comprises
a delay line having an odd number of equally spaced taps along the length thereof and having the input thereof at the input of such symmetric filter,
means for adding tap signals at taps in positions along said delay line which are symmetrically disposed about the center one of said taps,
separate tap multipliers connected to said center tap and to outputs of said adding means, respectively, said multipliers having predetermined multiplier coefficients to define said predetermined filtering characteristic,
means for adding outputs of said multipliers to produce a sum signal,
means for coupling said sum signal to provide a processed output of said nonrecursive filter,
means for coupling said center tap to provide an output corresponding to the input of said symmetric filter delayed by one-half of the delay of said delay line, and
means for coupling the final tap of said delay line to provide an output corresponding to the input to said delay line delayed by the full delay of said line.

16. The multisection filter in accordance with claim 4 in which
each of said sections has a plurality of passbands and a plurality of stopbands.

17. The combination in accordance with claim 3 in which
each of said filtering units has a plurality of passbands and a plurality of stopbands.

* * * * *

UNITED STATES PATENT AND TRADEMARK OFFICE
CERTIFICATE OF CORRECTION

PATENT NO. : 4,074,212

DATED : February 14, 1978

INVENTOR(S) : Richard W. Hamming and James F. Kaiser

It is certified that error appears in the above-identified patent and that said Letters Patent are hereby corrected as shown below:

Column 7, line 56 "is" should read --it--. Column 8, line 53, "n>1, m>1" should read --n$\geq$1, m$\geq$1--. Column 8, line 54, "n>o" should read --n$\geq$o--. Column 8, line 55, "m+o" should read --m=o--. Column 10, line 26, "is" should read --it--. Column 10, line 56 "hardward" should read --hardware--. Column 11, line 65, $$\sum_{k=o}^{M} \quad \text{should read} \quad \sum_{k=o}^{m}$$

Column 12, line 5, "nl" should read --n$\geq$1--.

Signed and Sealed this

Eleventh Day of July 1978

[SEAL]

Attest:

RUTH C. MASON
*Attesting Officer*

DONALD W. BANNER
*Commissioner of Patents and Trademarks*